US006934153B2

United States Patent
Lee et al.

(10) Patent No.: US 6,934,153 B2
(45) Date of Patent: Aug. 23, 2005

(54) HEAT SINK ASSEMBLY WITH FIXING MECHANISM

(75) Inventors: Hsieh Kun Lee, Tu-Chen (TW); Wan Lin Xia, Shenzhen (CN); Tao Li, Shenzhen (CN); Lei Li, Shenzhen (CN)

(73) Assignee: Hon Hai Precision Ind. Co., LTD, Taipei Hsien (TW)

( * ) Notice: Subject to any disclaimer, the term of this patent is extended or adjusted under 35 U.S.C. 154(b) by 172 days.

(21) Appl. No.: 10/648,117

(22) Filed: Aug. 25, 2003

(65) Prior Publication Data

US 2004/0125566 A1 Jul. 1, 2004

(30) Foreign Application Priority Data

Dec. 31, 2002 (TW) ...................................... 91221594 U

(51) Int. Cl.[7] .............................................. H05K 7/20
(52) U.S. Cl. ...................... 361/697; 24/459; 165/80.3; 165/121; 248/505; 248/510; 257/719; 361/710; 361/719; 361/704
(58) Field of Search .............................. 165/80.3, 185, 165/121, 122; 24/294–296, 450–459; 248/505, 510, 457–458; 257/718–719, 726–727; 361/704, 707, 709–710, 694–697

(56) References Cited

U.S. PATENT DOCUMENTS

| 6,332,251 B1 | * | 12/2001 | Ho et al. ....................... 24/459 |
| 6,449,152 B1 | * | 9/2002 | Lin ............................. 361/697 |
| 6,450,248 B1 | * | 9/2002 | Chang ....................... 165/80.3 |
| 6,525,941 B1 | * | 2/2003 | Lai ............................. 361/697 |
| 6,822,864 B2 | * | 11/2004 | Huang et al. ............... 361/697 |

FOREIGN PATENT DOCUMENTS

TW            364619           7/1999

* cited by examiner

Primary Examiner—Gregory Thompson
(74) Attorney, Agent, or Firm—Wei Te Chung

(57) ABSTRACT

A heat sink assembly includes a heat sink (80), a pair of fixing devices (40), a pair of clips (20), and a fan (90). Each clip includes a main body (24), and an operating arm (22) pivotally attached to the main body. The main body has two locking arms (246) each forming a slanted guiding portion (248) and a hook (249). Each fixing device has a top plate (42) for securing the fan thereon, and a support plate (46) for supporting the clips. A pair of tabs (49) and a pair of tongues (492) is formed at each of opposite ends of each fixing device, and defines a through hole (494) for receiving a corresponding locking arm. When the operating arm is rotated to raise the main body, the tongues guide the guiding portions and cause the hooks to tightly engage in locking holes (62) of a retention module (60).

18 Claims, 4 Drawing Sheets

HEAT SINK ASSEMBLY WITH FIXING MECHANISM

BACKGROUND OF THE INVENTION

1. Field of the Invention

The present invention relates to a heat sink assembly, and more specifically to a heat sink assembly having a fixing mechanism for readily securing a fan to a heat sink and pressing the heat sink onto an electronic package.

2. Prior art

Developments in today's highly information-intensive society have led to remarkable improvements in performances of electronic devices. During operation of many contemporary electronic devices, large amounts of heat are produced. Such heat must be efficiently removed from the electronic device, to prevent the system from becoming unstable or being damaged. Typically, a heat sink is attached to an outer surface of the device to facilitate removal of heat therefrom. A fan is often attached to the heat sink to provide forced air convection therefrom.

FIG. 4 shows a conventional heat sink assembly, which includes a heat sink 14, a clip 10, a fan 16 and a fan fixing frame 12. The fan 16 is mounted to the fixing frame 12 by a plurality of screws. The fixing frame 12 is attached onto the heat sink 14. Then the combined heat sink and fan is secured to a top surface of an electronic package by means of the clip 10. The clip 10 includes a main body 102 and a handle lever 104. The handle lever 104 must extend through a hole of the fixing frame 12 for manual operation. However, the clip 10 is limited by the fixing frame 12, wherein the assembly and operation processes are unduly inconvenient. Furthermore, the main body 102 of the clip 10 has no positioning structure, and is therefore prone to be tilted and vibrated.

Therefore, an improved heat sink assembly which overcomes the above-mentioned problems is desired.

BRIEF SUMMARY OF THE INVENTION

Accordingly, an object of the present invention is to provide a heat sink assembly having a fixing mechanism which readily attaches a fan to a heat sink and a clip which securely presses the heat sink onto a Central Processing Unit (CPU).

Another object of the present invention is to provide a heat sink assembly which has a positioning/guiding structure to resist movement of a clip when the assembly is subjected to vibration or shock.

To achieve the above-mentioned objects, a heat sink assembly in accordance with the present invention comprises a heat sink, a pair of fixing devices, a pair of clips, and a fan. Each clip comprises a main body, and an operating arm pivotally attached to the main body. The main body has two locking arms each forming a slanted guiding portion and a hook. Each fixing device has a top plate for securing the fan thereon, and a support plate for supporting the clips. A pair of tabs and a pair of tongues is formed at opposite ends of each fixing device, and defines a through hole for receiving a corresponding locking arm. When the operating arm is rotated to raise the main body, the tongues guide the guiding portions and cause the hooks to tightly engage in locking holes of a retention module.

Other objects, advantages and novel features of the present invention will be drawn from the following detailed description of preferred embodiments of the present invention with the attached drawings, in which:

DESCRIPTION OF THE PREFERRED EMBODIMENTS

Figure 1:
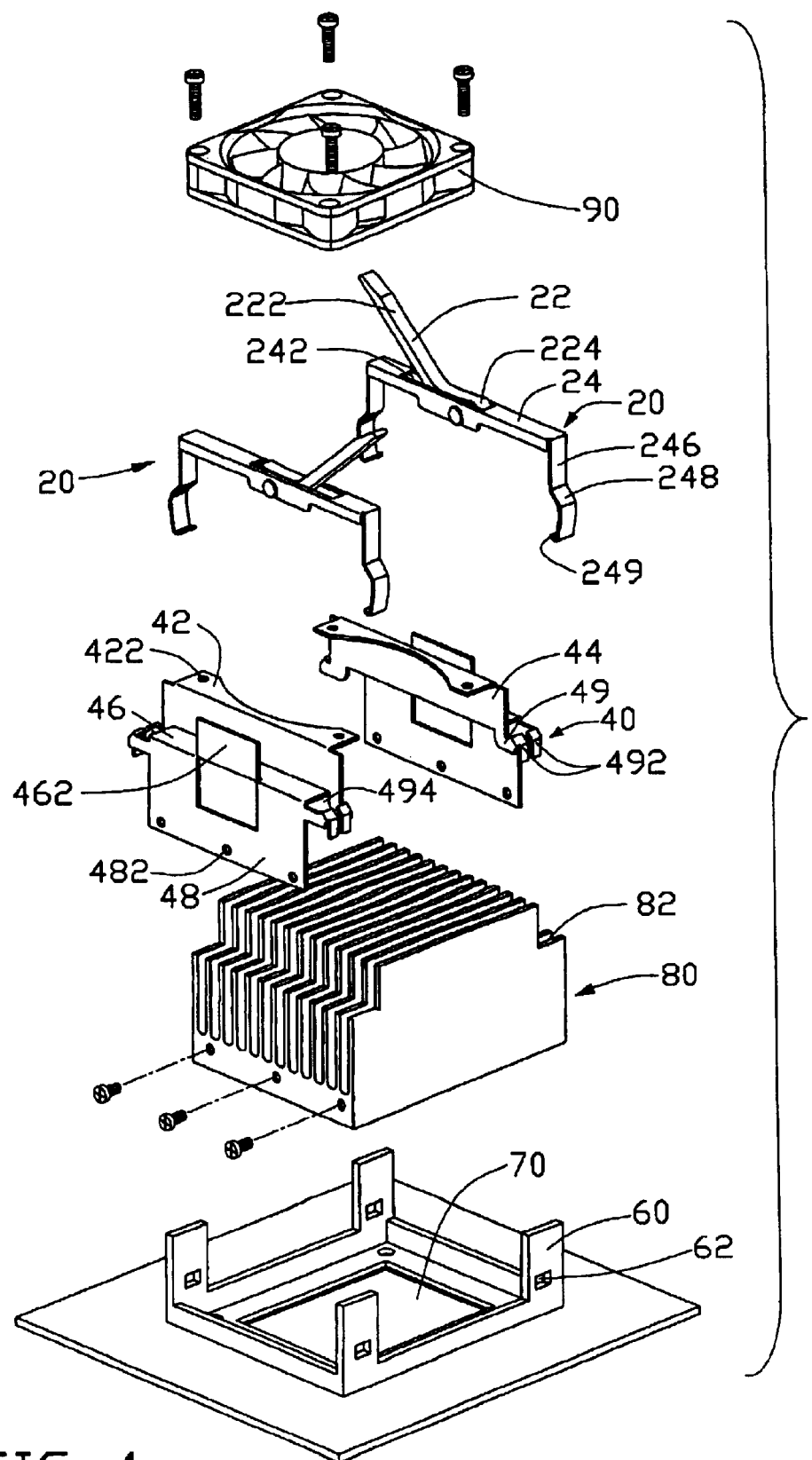
FIG. 1 is an exploded isometric view of a heat sink assembly in accordance with a preferred embodiment of the present invention, for mounting onto a CPU and a retention module.

Referring to FIG. 1, a heat sink assembly in accordance with the preferred embodiment of the present invention comprises a heat sink 80, a pair of fixing devices 40, a pair of clips 20, and a fan 90. The clips 20 are extended through the fixing devices 40 and engaged with a retention module 60, in order to press the heat sink 80 onto a CPU 70.

Each clip 20 comprises a main body 24, and an operating arm 22 pivotally attached to the main body 24. The operating arm 22 comprises a handle 222, and an end cam portion 224. The main body 24 defines a receiving slot 242 in a middle thereof. The handle 222 of the operating arm 22 is received in the slot 242, and is pivotably engaged with the main body 24. Two locking arms 246 depend from opposite ends of the main body 24. A slanted guiding portion 248 is formed at a middle section of each locking arm 246. A hook 249 is formed at a distal end of each locking arm 246.

Each fixing device 40 comprises a top plate 42. The top plate 42 defines a pair of fixing holes 422, corresponding to through holes of the fan 90. An arch-shaped cutout is defined in an inner side of the top plate 42 for providing more ventilation access for cooling air generated by the fan 90. A first side wall 44 depends from an outer side of the top plate 42. A support plate 46 extends horizontally outwardly from a bottom end of the first side wall 44. A blocking plate 462 is bent upwardly from an outer edge of the support plate 46. A second side wall 48 depends from the outer edge of the support plate 46, and is parallel with the first side wall 48. A plurality of apertures 482 is defined in a bottom portion of the second side wall 48, for extension of screws therethrough to engage the fixing device 40 to the heat sink 80. A tab 49 extends from each of opposite ends of each of the first and second side walls 44. Thus a pair of tabs 49 at corresponding ends of the first and second side walls 44 oppose each other, and another pair of tabs 49 at opposite corresponding ends of the first and second side walls 44 oppose each other. A pair of tongues 492 is bent toward each other from respective outmost ends of each pair of tabs 49. Each pair of tabs 49 and the corresponding pair of tongues 492 cooperatively define a through hole 494 therebetween.

The heat sink 80 defines a pair of shoulders 82 at each of opposite sides thereof respectively. The retention module 60 defines four locking holes 62 in four corner pillars thereof respectively.

Figure 2:
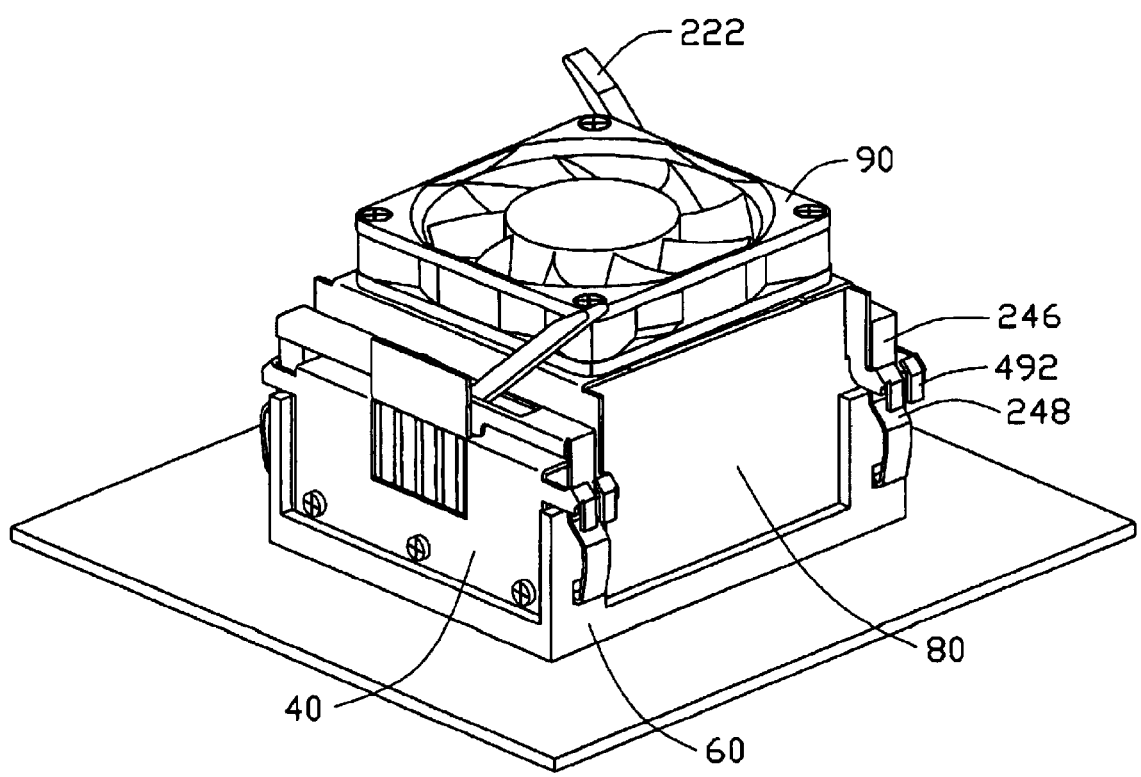
FIG. 2 is an assembled view of FIG. 1, showing clips thereof in unlocked positions.

Referring to FIG. 2, in assembly, each clip 20 is seated on the support plate 46 of a corresponding fixing device 40, with the locking arms 246 extending through the through holes 494. The blocking plate 462 of the fixing device 40 prevents the clip 20 sliding off from the support plate 46. The support plate 46 of each fixing device 40 is seated on a corresponding shoulder 82 of the heat sink 80. A plurality of screws is extended through the apertures 482 and engaged in the heat sink 80, thereby securing the fixing devices 40 to the opposite sides of the heat sink 80. The hooks 249 of the clips 20 are loosely received in locking holes 62 of the retention module 60. The fan 90 is then placed on the top plates 42 of the fixing devices 40. Screws are extended through the through holes of the fan 90 and engaged in the fixing holes 422 of the fixing devices 40, thereby securing the fan 90 to the fixing devices 40.

Figure 3:
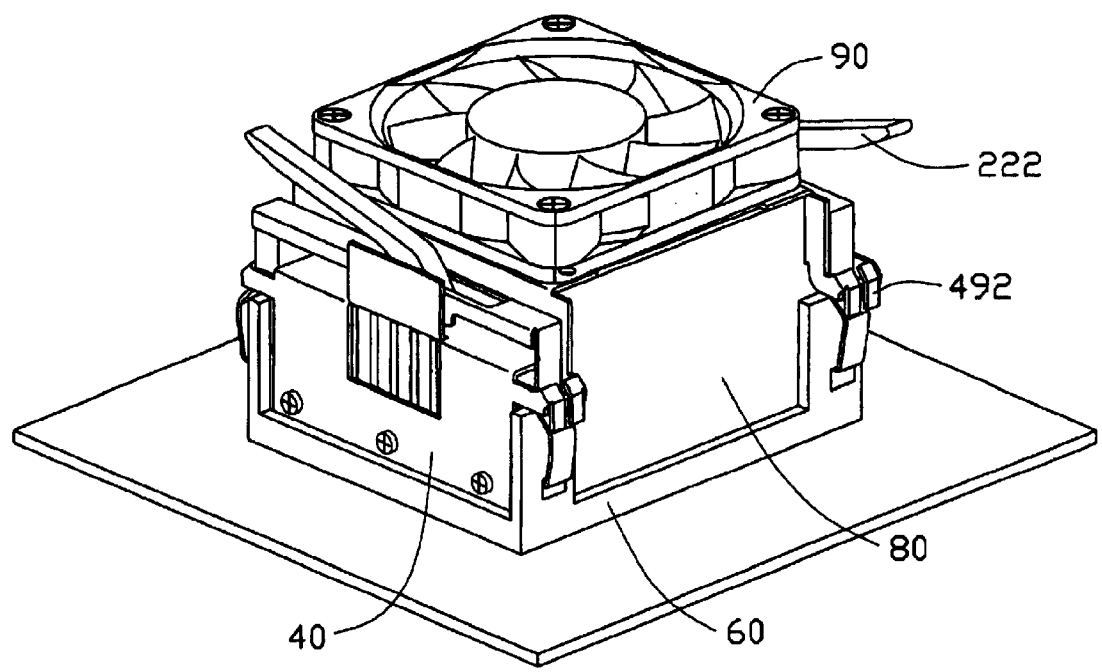
FIG. 3 is similar to FIG. 2, but showing the clips in locked positions.
Figure 4:
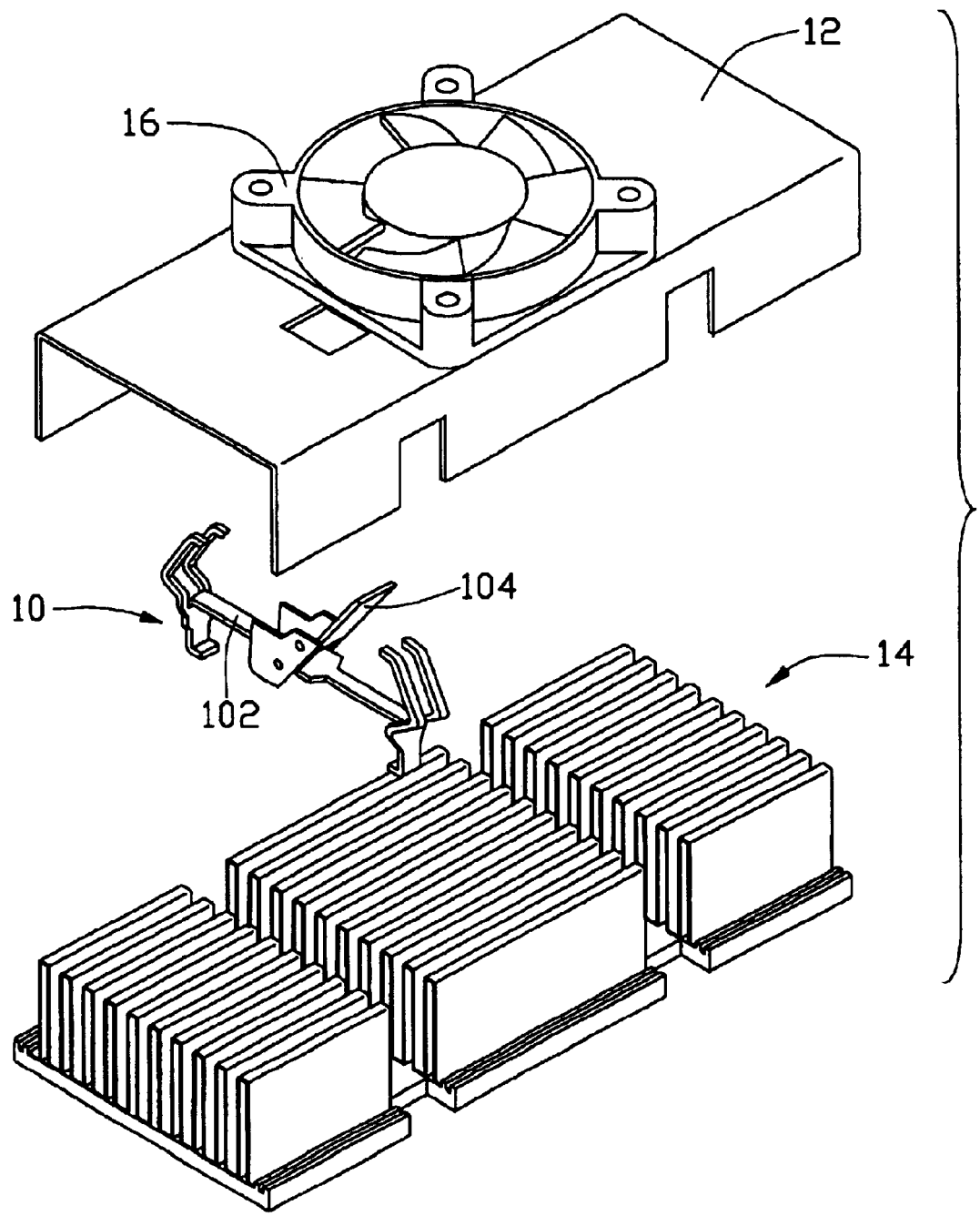
FIG. 4 is an exploded view of a conventional heat sink assembly.

Referring also to FIG. 3, in operation, the operating arm 22 of each clip 20 is rotated. The cam portion 224 of the operating arm 22 presses the support plate 46 of the corresponding fixing device 40, so that the main body 24 of the clip 20 is raised relative to the fixing device 40. The guiding portion 248 of each locking arm 246 is restrained by the corresponding tongues 492 of the fixing device 40. Therefore the guiding portion 248 moves inwardly as well as being driven upwardly by the main body 24. Therefore the hook 249 of the locking arm 246 moves inwardly as well as being driven upwardly. As a result, the hooks 249 of the locking arms 246 are fully received in the locking holes 62 of the retention module 60, and firmly engage with the pillars of the retention module 60 at top extremities of the locking holes 62.

In an alternative embodiment of the present invention, the hooks 249 of the clips 20 can be replaced by locking holes, and the locking holes 62 of the retention module 60 can be replaced by protruding catches. In a further alternative embodiment of the present invention, the separated fixing devices 40 can be integrally formed as a single piece.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A fixing assembly, comprising:
a clip adapted to attach a heat sink to an electronic package, the clip comprising a main body and an operating arm pivotally attached to the main body, two locking arms depending from the main body, a guiding portion formed at each of the locking arms; and
a fixing device adapted to secure a fan on the heat sink, the fixing device comprising a top plate adapted to secure the fan thereon, and a support plate supporting the clip thereon, two opposite ends of the fixing device forming two tongues and defining two through holes thereat; wherein
the main body of the clip rests on the support plate of the fixing device, the locking arms of the clip extend through the through holes of the fixing device, and wherein when the locking arms are moved in a first direction, the guiding portions are guided by the tongues in second and third directions, the second and third directions being opposite to each other and perpendicular to the first direction wherein the fixing device defines a plurality of apertures adapted for extension of fasteners therethrough in order to attach the fixing device to the heat sink.

2. The fixing assembly as described in claim 1, wherein the operating arm comprises a handle and a cam portion, and the cam portion is rotated to drive the main body to move in the first direction.

3. The fixing assembly as described in claim 1, wherein the fixing assembly comprises two said clips, and two said fixing devices adapted to be secured to opposite sides of the heat sink respectively.

4. The fixing assembly as described in claim 1, wherein the top plate of the fixing device defines a plurality of fixing holes adapted for extension of fasteners therethrough in order to secure the fan to the fixing device.

5. The fixing assembly as described in claim 1, wherein a first side wall connects the top plate and the supporting plate, and a second side wall depends from the supporting plate.

6. The fixing assembly as described in claim 5, wherein a blocking plate is bent upwardly from the support plate, for preventing the clip from sliding off from the support plate.

7. The fixing assembly as described in claim 1, wherein said two opposite ends of the fixing device form two tabs, the tongues extend inwardly from the tabs, and the tabs and tongues cooperatively define the two through holes thereat.

8. The fixing assembly as described in claim 1, wherein the guiding portion slants downwardly and outwardly.

9. The fixing assembly as described in claim 1, wherein each of the locking arms forms a hook at a distal end thereof.

10. A heat sink assembly comprising:
a heat sink;
a retention module disposed around the heat sink;
a fixing assembly comprising:
a pair of clips for attaching the heat sink to an electronic package, each of the clips comprising a main body and a operating arm pivotally connected to the main body, two locking arms depending from opposite ends of each of the clips, each of the locking arms forming a slanted guiding portion; and
a fixing device attached to the heat sink, the fixing device forming a plurality of tongues corresponding to the guiding portions of the locking arms for guiding the locking arms to engage with the retention module; and
a fan attached to the fixing device.

11. The heat sink assembly as described in claim 10, wherein the fixing device comprises a top plate on which the fan is secured, a pair of first side walls depending from the top plate, a pair of support plates perpendicularly extending from the first side walls, and a pair of second side walls depending from the support plates.

12. The heat sink assembly as described in claim 11, wherein each of opposite ends of each of the first and second side walls forms a tab, each of the tongues is bent from a corresponding tab, each of the tabs and a corresponding tongue cooperatively define a through hole thereat, and a corresponding locking arm extends through the through hole.

13. The heat sink assembly as described in claim 10, wherein a pair of blocking plates is bent upwardly from the support plates, for preventing the clips sliding off from the support plates.

14. The heat sink assembly as described in claim 10, wherein a hook is formed at an end of each of the locking arms, and the retention module defines a plurality of locking holes respectively corresponding to the hooks of the locking arms.

15. The heat sink assembly as described in claim 10, wherein the operating arm comprises a handle and a cam portion opposite from the handle.

16. A heat sink assembly comprising:
a retention module defining a first retention device;
an electronic package surrounded by said retention module;
a heat sink intimately seated upon the electronic package;
a fixing device mounted upon the heat sink and including a plate;

a fan seated upon the heat sink and retained by said plate; and a clip including an elongated main body seated upon and downwardly pressing the fixing device, and at least a locking arm defining a second retention device thereon; wherein when said clip is deflected in a locking manner, said first retention and said second retention device are coupled to each other, and said clip urges, via said fixing device, said heat sink to move toward and intimately abut against the electronic package wherein said fixing device is constantly secured to the heat sink.

17. The assembly as described in claim 16, wherein said fixing device includes at least one tongue to urge the second retention device to be coupled to the first device when the clip is in the locked manner.

18. The assembly as described in claim 16, wherein said fixing device is constantly secured to the fan.

* * * * *